United States Patent
Lee et al.

(10) Patent No.: US 8,618,550 B2
(45) Date of Patent: Dec. 31, 2013

(54) LARGE AREA ORGANIC LIGHT EMITTING DIODE DISPLAY

(75) Inventors: Jaehyuk Lee, Paju-si (KR); Byungchul Ahn, Seoul (KR); Yoonheung Tak, Goyang-si (KR); Woojin Nam, Goyang-si (KR); Duhwan Oh, Gyeongbuk (KR); Younghoon Shin, Paju-si (KR); Honggyu Kim, Uiwang-si (KR); Myungseop Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/560,759

(22) Filed: Jul. 27, 2012

(65) Prior Publication Data
US 2013/0026505 A1 Jan. 31, 2013

(30) Foreign Application Priority Data

Jul. 29, 2011 (KR) .................. 10-2011-0075733
Jul. 19, 2012 (KR) .................. 10-2012-0078899

(51) Int. Cl.
*H01L 27/14* (2006.01)

(52) U.S. Cl.
USPC .................. 257/72; 257/40; 257/59; 257/258

(58) Field of Classification Search
USPC ........................... 257/40, 59, 72, 258
See application file for complete search history.

(56) References Cited

U.S. PATENT DOCUMENTS

2011/0241563 A1* 10/2011 Kim et al. .................. 315/291

* cited by examiner

*Primary Examiner* — Tan N Tran
(74) *Attorney, Agent, or Firm* — Birch, Stewart, Kolasch & Birch, LLP (57) ABSTRACT

The invention relates to a large area organic light emitting diode display having a uniformed luminescence throughout the display area. The invention suggests an organic light emitting diode display comprising a thin film transistor substrate including a thin film transistor, a driving current line to supply an electric signal to the thin film transistor, a driving line contact hole to expose some portions of the driving current line, and an organic light emitting diode connected to the thin film transistor; a cap including a cap substrate and an auxiliary electrode disposed on a surface of the cap substrate with an area that is at least ⅓ of an area of the cap substrate; a conductive sealing material to electrically connect the auxiliary electrode and the driving current line through the driving line contact hole; and an organic adhesive joining the thin film transistor substrate and the cap.

15 Claims, 4 Drawing Sheets

FIG. 1

Related Art

FIG. 2

Related Art

LARGE AREA ORGANIC LIGHT EMITTING DIODE DISPLAY

This application claims priority to and the benefit of Korean Patent Application No. 10-2011-0075733 filed on Jul. 29, 2011 and Korean Patent Application No. 10-2012-0078899 filed on Jul. 19, 2012, each of which is incorporated herein by reference for all purposes as if fully set forth herein.

BACKGROUND OF THE INVENTION

1. Field of the Invention

Embodiments of the invention relate to a large area organic light emitting diode display having a uniformed luminescence throughout the display area. Especially, the embodiments of the invention relate to an organic light emitting diode display having a uniformed luminescence throughout the large display area such as a large flat panel television set.

2. Discussion of the Related Art

Nowadays, various flat panel display devices are being developed for overcoming many drawbacks of the cathode ray tube such as heavy weight and bulk volume. The flat panel display devices include a liquid crystal display device (LCD), a field emission display (FED), a plasma display panel (PDP) and an electroluminescence device (EL).

Figure 1:
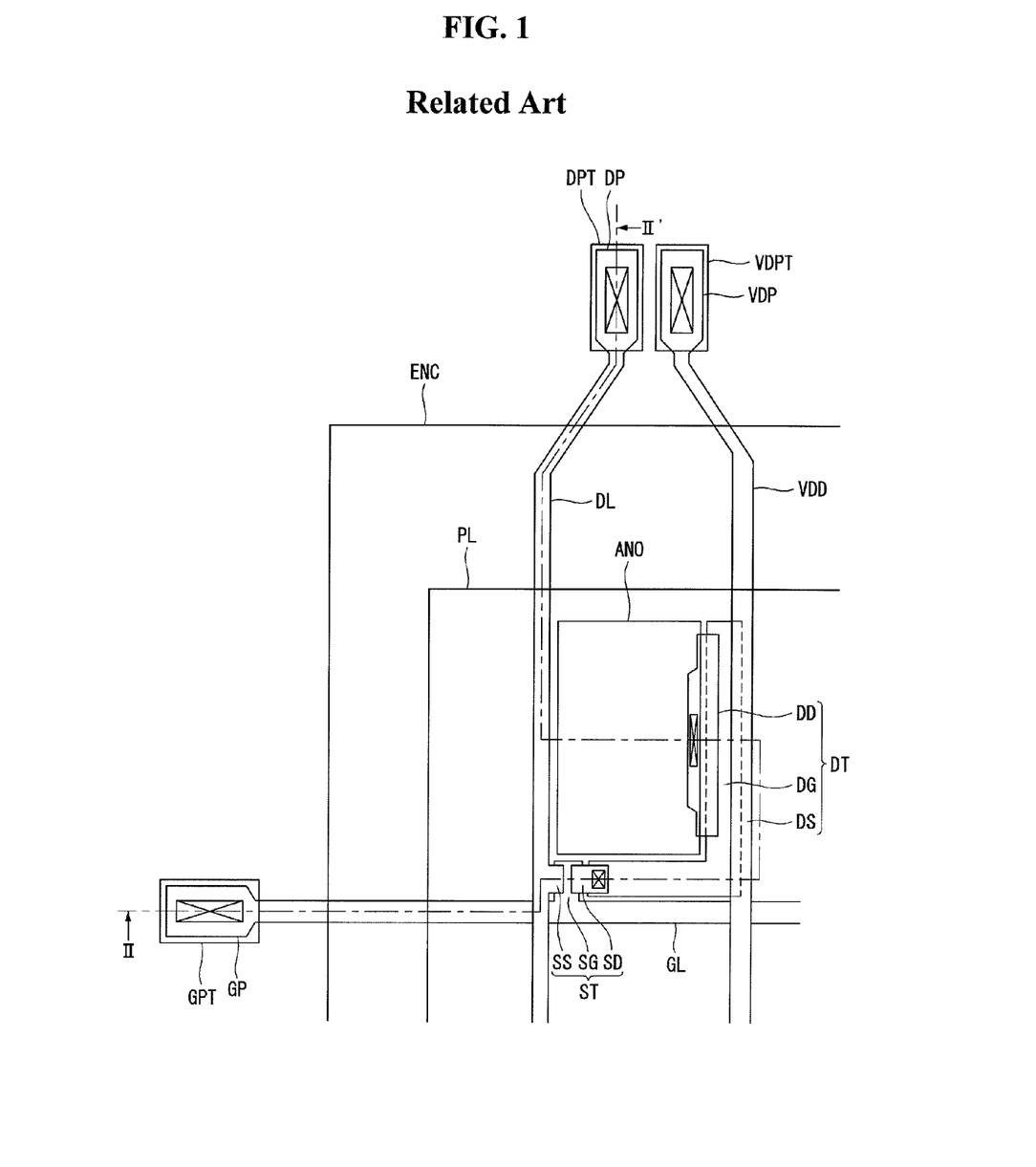
FIG. 1 is a plane view illustrating a structure of an organic light emitting diode (OLED) display having active switching elements such as thin film transistors according to a related art.
Figure 2:
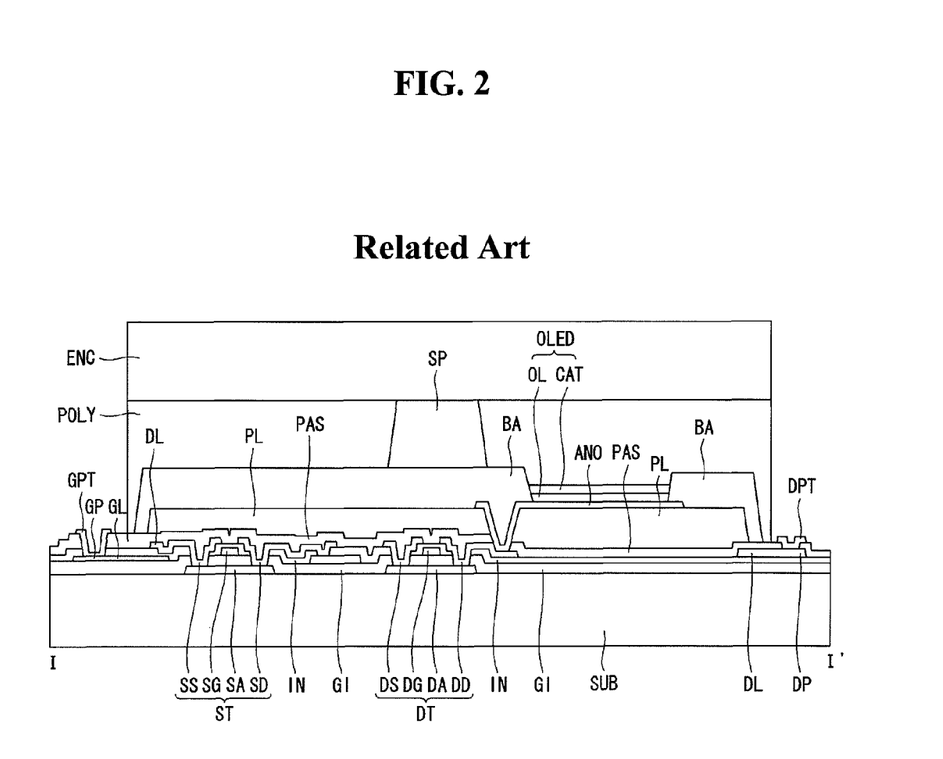
FIG. 2 is a cross sectional view illustrating the structure of the OLED display along a cutting line of II-II' in FIG. 1 according to the related art.

FIG. 1 is a plane view illustrating a structure of an organic light emitting diode display ('OLED') having active switching elements such as thin film transistors according to a related art. FIG. 2 is a cross sectional view illustrating the structure of the OLED along a cutting line of II-II' in FIG. 1 according to the related art.

Referring to FIGS. 1 and 2, the OLED comprises a thin film transistor ('TFT') substrate having thin film transistors ST and DT, an organic light emitting diode OD connected to and driven by the thin film transistors ST and DT, and a cap ENC joining and facing the TFT substrate with an organic adhesive POLY therebetween. The TFT substrate includes a switching thin film transistor ST, a driving thin film transistor DT connected to the switching thin film transistor ST, and the organic light emitting diode OD connected to the driving thin film transistor DT.

On a transparent substrate SUB, the switching thin film transistor ST is formed where a gate line GL and a data line DL cross each other. The switching thin film transistor ST acts for selecting a pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OD.

As one example, FIG. 2 shows a thin film transistor of a top gate structure. In this instance, the semiconductor channel layers SA and DA of the switching thin film transistor ST and the driving thin film transistor DT, respectively, are firstly formed on the substrate SUB and the gate insulating layer GI covers them, and then the gate electrodes SG and DG are formed thereon by overlapping with center portions of the semiconductor channel layers SA and DA. After that, at both sides of the semiconductor channel layers SA and DA, the source electrodes SS and DS and the drain electrodes SD and DD are connected thereto, respectively, through contact holes penetrating an insulating layer IN. The source electrodes SS and DS and the drain electrodes SD and DD are formed on the insulating layer IN.

In addition, at the outer area surrounding the display area where the pixel area is disposed, a gate pad GP formed at one end of the gate line GL, a data pad DP formed at one end of the data line DL, and a driving current pad VDP formed at one end of the driving current line VDD are arrayed. A passivation layer PAS is disposed to cover the upper whole surface of the substrate SUB having the switching and the driving thin film transistors ST and DT. After that, formed are the contact holes exposing the gate pad GP, the data pad DP, the driving current pad VDP and the drain electrode DD of the driving thin film transistor DT. Over the display area within the substrate SUB, a planar layer PL is coated. The planar layer PL makes more smooth a roughness of an upper surface of the substrate SUB, for coating organic materials that form the organic light emitting diode on the smooth and planar surface of the substrate SUB.

On the planar layer PL, the anode electrode ANO is formed to connect to the drain electrode DD of the driving thin film transistor DT through one of the contact holes. On the other hand, at the outer area of the display area not having the planar layer PL, formed are a gate pad electrode GPT, a data pad electrode DPT and a driving current electrode VDPT connected to the gate pad GP, the data pad DP and the driving current pad VDP, respectively, and exposed through the contact holes. On the substrate SUB, a bank BA is formed covering the display area, except for the pixel area. Finally, a spacer SP may be formed over some portion of the bank BA.

A cap ENC is joined to the TFT substrate having above mentioned structure with the constant gap therebetween, due to the spacer SP. In that instance, it is preferable that the TFT substrate and the cap ENC are completely sealed by having an organic adhesive POLY disposed between them. The gate pad electrode GPT and the data pad electrode DPT exposed to the exterior of the cap ENC may be connected to external devices via various connecting means.

When the OLED having the above mentioned structure is applied to a large display such as large flat panel television set, there may be a lot of problems which are not expected and/or occur in a small area display such as a cellular phone, a personal digital device and so on. Therefore, when applying OLED technology to a large area display, consideration of many conditions which are not considered for the small area display may be required.

For example, when manufacturing a large area OLED display, a length of each electric signal lines including the gate line GL, the data line DL and the driving current line VDD should be elongated as a size of an OLED panel is increased. As the electric signal line is elongated, line resistance is also increases. Such increase in the line resistance may cause a voltage dropdown problem in which a voltage is lowered under a normal operating condition. When the voltage dropdown occurs, luminescence and/or brightness of the OLED panel is not evenly distributed over the whole area of the OLED panel. Actually, in an instance of an OLED of which a diagonal length is over 20 inches and is driven by 20A of electric currents, according to the related art, a luminescence difference between a brightest point (i.e., a beginning point of the electric current line) and a darkest point (i.e., an end point of the electric current line) may be over 37%.

SUMMARY OF THE INVENTION

In order to overcome the above mentioned drawbacks, the purpose of the embodiments of the invention is to suggest a large area organic light emitting diode display having uniformed brightness distribution throughout the display panel area. Another purpose of the embodiments of the invention is to suggest an organic light emitting diode display in which the line resistance of the electric signal lines crossing the display panel area is not increased proportional to the length increasement of the electric signal lines, even if the diagonal length of the display panel may be increased over 20 inches. Yet another purpose of the embodiments of the invention is to suggest an organic light emitting diode display in which the voltage dropdown is not occurred at any electric signal lines, even if the length of the electric signal lines may be twice, three times or more than that of the portable or the desktop display panel.

In order to accomplish the above purposes and other purposes, the embodiments of the invention includes an organic light emitting diode display including a thin film transistor substrate including a thin film transistor, a driving current line to supply an electric signal to the thin film transistor, a driving line contact hole to expose some portions of the driving current line, and an organic light emitting diode connected to the thin film transistor; a cap including a cap substrate and an auxiliary electrode disposed on a surface of the cap substrate with an area that is at least ⅓ of an area of the cap substrate; a conductive sealing material to electrically connect the auxiliary electrode and the driving current line through the driving line contact hole; and an organic adhesive joining the thin film transistor substrate and the cap.

The auxiliary electrode includes a metal material having a resistivity of less than or equal to 5.0 $\mu\Omega cm^2$.

The auxiliary electrode includes at least one of copper (Cu), nickel (Ni), and aluminum (Al).

The auxiliary electrode includes a low electric resistance metal layer and a high corrosive resistance metal layer.

The low electric resistance metal layer includes at least one of copper (Cu), nickel (Ni), and aluminum (Al); and the high corrosive resistance metal layer includes at least one of titanium (Ti), molybdenum (Mo) and tantalum (Ta).

The auxiliary electrode includes a triple layer structure having at least one of Mo/Cu/Mo, Ta/Cu/Ta, MoTi/Cu/MoTi.

A summation of areas of the driving current line exposed by the driving line contact hole is at least 0.1% of a whole area of the auxiliary electrode.

The conductive sealing material includes a base material including at least one of epoxy, acryl and silicon; and a plurality of conductive balls including a metal material having an electric conductivity of about $0.2 \times 10^6$ $\Omega$/cm.

The conductive balls include at least one of gold (Au), silver (Ag), copper (Cu) and nickel (Ni).

A content ratio between the conductive balls and the base material is from 3 (wt %):97 (wt %) to 5 (wt %):95 (wt. %).

The base material has a viscosity in a range from 50,000 cPs to 250,000 cPs.

The display device according to the embodiments of the invention includes an auxiliary electrode disposed throughout the inner surface of the cap, and the driving current line is connected to the auxiliary electrode. Therefore, the driving current line has the equivalent voltage through all of the line length crossing the substrate due to the auxiliary electrode covering the substrate range. The driving current line does not have voltage dropdown even when the display area is enlarged. Consequently, even when the organic light emitting diode display is applied to a large display panel of over 40-inches, the luminescence and/or brightness distribution can be uniformed throughout the display panel area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Referring to the attached figures, discussed are example embodiments of the invention. Like reference numerals designate like elements throughout the detailed description. However, the invention is not restricted by these embodiments but can be applied to various changes or modifications without departing from the scope and spirit of the invention. In the following embodiments, names of elements are used by considering the ease for explanation so that they may be different from actual or commonly used names.

Figure 3:
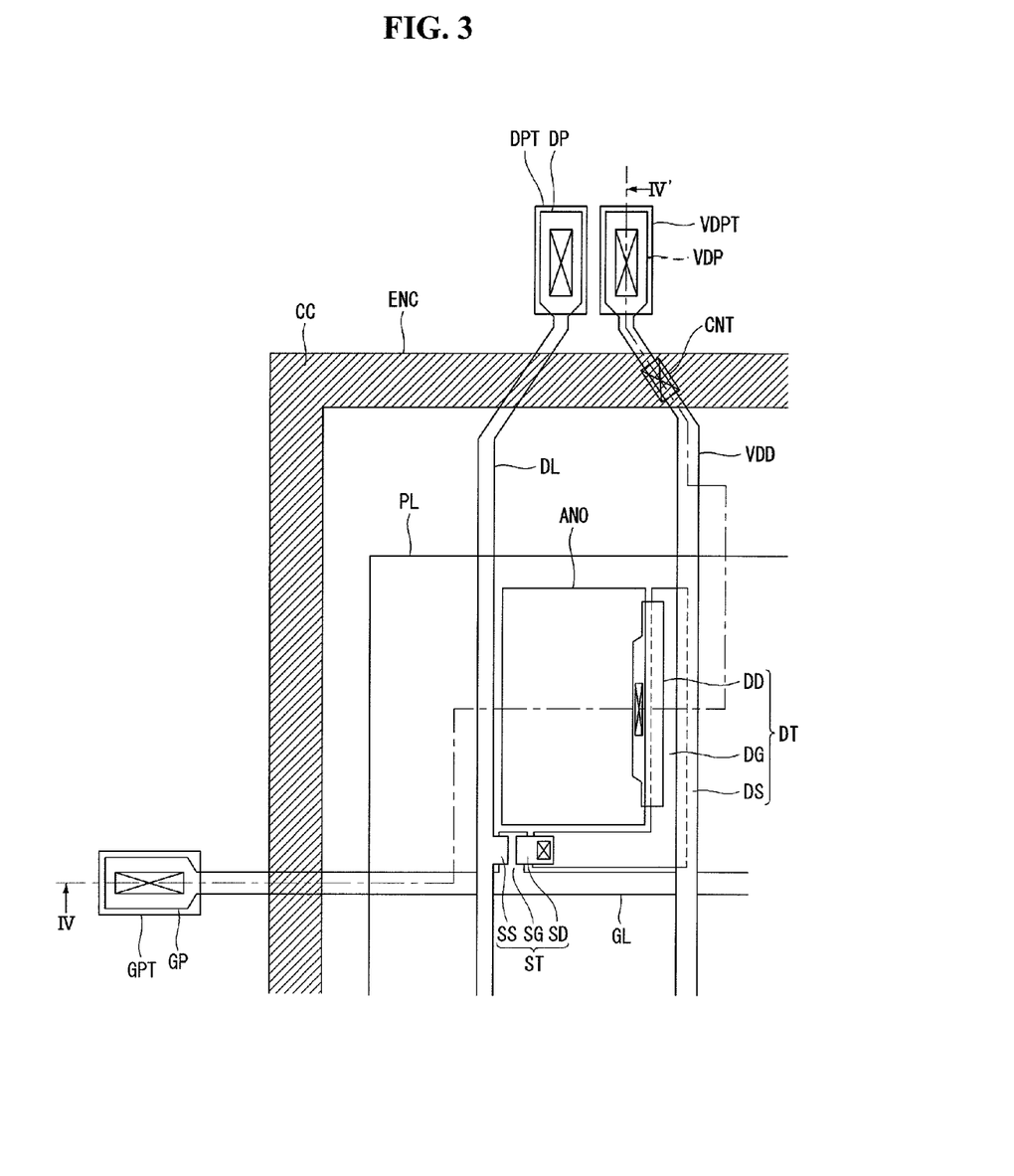
FIG. 3 is a plane view illustrating a structure of an organic light emitting diode (OLED) display according to an embodiment of the invention.
Figure 4:
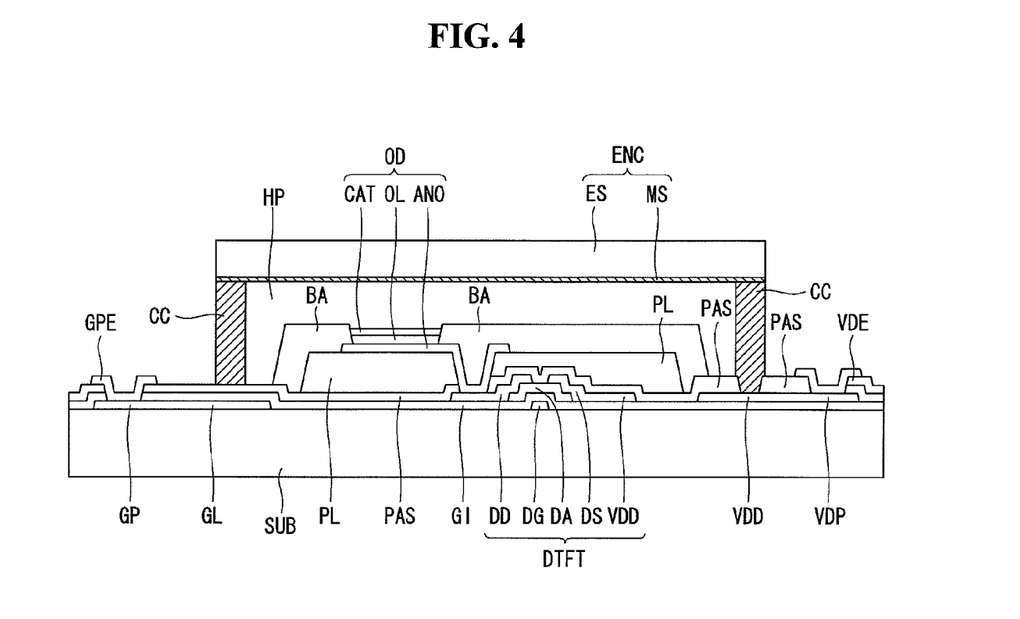
FIG. 4 is a cross sectional view illustrating the structure of the OLED display along a cutting line of IV-IV' in FIG. 3, according to the embodiment of the invention.

FIG. 3 is a plane view illustrating a structure of an organic light emitting diode (OLED) display according to an embodiment of the invention. FIG. 4 is a cross sectional view illustrating the structure of the OLED display along a cutting line of IV-IV' in FIG. 3, according to the embodiment of the invention.

Referring to FIGS. 3 and 4, the OLED comprises a thin film transistor (TFT) substrate having thin film transistors ST and DT, an organic light emitting diode OD connected to and driven by the thin film transistors ST and DT, and a cap ENC joining and facing the TFT substrate with an organic adhesive POLY disposed therebetween. The TFT substrate includes a switching thin film transistor ST, a driving thin film transistor DT connected to the switching thin film transistor ST, and the organic light emitting diode OD connected to the driving thin film transistor DT.

An explanation about the thin film transistor (TFT) substrate in detail is as follows. On a transparent substrate SUB, the switching thin film transistor ST is formed where a gate line GL and a data line DL cross each other. The switching thin film transistor ST acts to select a pixel which is connected to the switching thin film transistor ST. The switching thin film transistor ST includes a gate electrode SG branching from the gate line GL, a semiconductor channel layer SA overlapping with the gate electrode SG in a manner similarly shown in FIG. 1, a source electrode SS and a drain electrode SD. The driving thin film transistor DT acts to drive an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OD.

In FIGS. 3 and 4, a thin film transistor of a top gate structure is illustrated, but any other structures may be applied. In the instance of FIG. 3 and, the semiconductor channel layers SA and DA of the switching thin film transistor ST and the driving thin film transistor DT are firstly formed on the substrate SUB and a gate insulating layer GI covers them, and then the gate electrodes SG and DG are formed thereon by overlapping with center portions of the semiconductor channel layers SA and DA. After that, at respective sides of the semiconductor channel layers SA and DA, the respective source electrodes SS and DS and the respective drain electrodes SD and DD are connected thereto through contact holes penetrating an insulating layer IN. The source electrodes SS and DS and the drain electrodes SD and DD are formed on the insulating layer IN.

In addition, at an outer area surrounding a display area where the pixel area is disposed, a gate pad GP formed at one end of the gate line GL, a data pad DP formed at one end of the data line DL, and a driving current pad VDP formed at one end of a driving current line VDD are arrayed. A passivation layer PAS is disposed to cover an upper whole surface of the substrate SUB having the switching and the driving thin film transistors ST and DT. After that, formed are the contact holes exposing the gate pad GP, the data pad DP, the driving current pad VDP and the drain electrode DD of the driving thin film transistor DT. Over the display area within the substrate SUB, a planar layer PL is coated. The planar layer PL makes more smooth a roughness of an upper surface of the substrate SUB, for coating organic materials that form the organic light emitting diode on the smooth and planar surface of the substrate SUB.

On the planar layer PL, the anode electrode ANO is formed to connect to the drain electrode DD of the driving thin film transistor DT through one of the contact holes. On the other hand, at the outer area of the display area not having the planar layer PL, formed are a gate pad electrode GPT, a data pad electrode DPT and a driving current electrode VDPT connected to the gate pad GP, the data pad DP and the driving current pad VDP, respectively, and exposed through the contact holes. On the substrate SUB, a bank BA is formed covering the display area, except for the pixel area.

After that, using an organic thin film depositing processes, the anode electrode ANO and the organic layers are stacked thereover. On the organic layers, a cathode electrode CAT is stacked to complete the organic light emitting diode OD.

A cap ENC is joined to the TFT substrate having the above mentioned structure with a constant gap (or cell gap) therebetween. In that instance, it is preferable but not required that the TFT substrate and the cap ENC are completely sealed by using an organic adhesive HP having a high adhesiveness, a high strength, and a high flatness property over a large area. By providing high sealing property and high flatness property over the large area, the organic adhesive HP can maintain the cell gap between the TFT substrate and the cap ENC evenly without the spacer used in the related art. For one example, the organic adhesive HP may be formed by depositing a macromolecule resin material. For another example, the organic adhesive HP can be formed by inserting a macromolecule film between the TFT substrate and the cap ENC, and then by pressing the organic adhesive HP under a high temperature condition. The gate pad electrode GPT and the data pad electrode DPT exposed to the exterior of the cap ENC may be connected to external devices via various connecting means.

Embodiments of the invention are especially directed to a large area organic light emitting display having over 40-inch diagonal lengths. Each electric signal line may have an increasingly higher line resistance, as the OLED display panel becomes increasingly larger. Therefore, it is required for the structure and/or means to reduce or prevent the line resistance of each electric signal line from being higher and higher. Especially, for the driving current line VDD supplying a driving current used to drive the organic light emitting diode, and/or for a common line supplying a reference voltage, if the voltage dropdown problem occurs at these lines, the luminescence (or brightness) of each pixel may be lowered in a pixel that is located far away from start points of the lines.

In embodiments of the invention, in order to reduce or prevent the line resistance from being increasingly larger as the display area becomes increasingly larger, an auxiliary electrode MS is further formed on the inner surface of a cap substrate ES included in the cap ENC. The auxiliary electrode MS may be a metal sheet which is made by depositing a metal material on the whole inner surface of the cap substrate ES. Furthermore, the auxiliary electrode MS may be connected to the driving current line VDD at an area of a sealing CC (or a sealing CC area) when the cap ENC and the TFT substrate are joined and sealed to each other.

To do so, on the TFT substrate, some portions of the passivation layer PAS covering the driving current line VDD should be removed to expose some portions of the driving current line VDD. In detail, a driving line contact hole CNT exposing some portions of the driving current line VDD may be formed within the area where the sealing CC is formed by patterning the passivation layer PAS.

In addition, at the sealing CC area of the TFT substrate, a sealant having conductive balls (or particles) is deposited, while the organic adhesive HP is deposited at the area surrounded by the sealing CC area. When the TFT substrate and the cap ENC are joined and sealed, the auxiliary electrode MS would be facing towards the sealing CC area (or towards the TFT substrate). Then, the conductive balls can electrically connect the auxiliary electrode MS and the exposed portion of the driving current line VDD by a joining press force. Therefore, the voltage supplied to the driving current pad VDP is communicated through the driving current line VDD from a starting point to an end point of the driving current line VDD, and is also communicated through the auxiliary electrode MS to form an equivalent voltage throughout the cap substrate ES.

FIGS. 3 and 4 representing the preferred embodiment of the invention illustrate that the driving current line VDD is connected to the auxiliary electrode MS through the driving line contact hole CNT formed at the start portion of the driving current line VDD near to the driving current pad VDP. However, the voltage dropdown problem is usually occurred at the end portion of the driving current line VDD far from the driving current pad VDP. Therefore, it is required to make the voltage in equivalent condition over the whole length of the driving current line VDD from start portion to the end portion. To do so, it is preferable to further form the driving line contact hole CNT exposing the end portion of the driving current line VDD laid under the sealing CC area where is the opposite side from the driving current pad VDD on the substrate SUB. Through this additional driving line contact hole CNT, the end portion of the driving current line VDD is connected to the auxiliary electrode MS.

FIG. 3 shows the instance in which the sealing CC, which may be conductive (the conductive sealing CC) is disposed to surround all 4 sides of the substrate SUB. However, as mentioned above, when providing the high sealing property and high flatness property over a large area so that the organic adhesive HP can maintain the cell gap between the TFT substrate and the cap ENC evenly without a spacer, the conductive sealing CC may be only disposed at upper and lower sides of the substrate SUB where the conductive sealing CC is crossing the driving current line VDD.

As a result, even if the driving current line VDD becomes increasingly longer as the OLED display area becomes increasingly larger, thanks to the auxiliary electrode MS, the increasement of the line resistance is not proportional to the increasement of the line length. That is, the line resistance of the elongated driving current line VDD can be similar to that of the small area display panel. Furthermore, the organic light emitting diode display having the structure shown in embodiments of the invention may have the uniformed luminescence and/or brightness distribution throughout the whole display panel. Hereinafter, explanation about detailed characteristics for effectively reducing or preventing the voltage dropdown of the driving current line VDD with the auxiliary electrode MS will be provided.

First of all, the auxiliary electrode MS has the characteristics to decrease the line resistance of the driving current line VDD effectively. Therefore, a material of the auxiliary electrode MS should be considered. Preferably but not necessarily, the auxiliary electrode MS includes a metal material of which resistivity (or 'specific resistance') may be 5.0 $\mu\Omega cm^2$ (micro-ohm-square centimeter) or less. For example, it is preferable but not required that at least one of copper (Cu), nickel (Ni), and aluminum (Al) is used for the auxiliary electrode MS. On the other hand, the auxiliary electrode MS may comprise one metal layer or may comprise multi-metal layers including a high corrosive resistance metal layer and a low electric resistance metal layer and so on. That is, the auxiliary electrode MS may further include a protective layer of high corrosive resistance including at least one of titanium (Ti), molybdenum (Mo), tantalum (Ta), and molybdenum-titanium (MoTi) alloy. In one instance, when using aluminum and titanium, the auxiliary electrode MS may be configured to have a double layered structure of Al/Ti. In another instance, the auxiliary electrode MS may be configured to have a triple layered structure of Ti/Al/Ti. Furthermore, in order to have lower electric resistance, the auxiliary electrode MS may include copper (Cu). In that instance, as the copper is easily damaged by a corrosive material, the auxiliary electrode MS preferably but not necessarily has the triple layered structure, such as Ta/Cu/Ta, Ti/Cu/Ti, Mo/Cu/Mo or MoTi/Cu/MoTi.

Next, the auxiliary electrode MS preferably but not necessarily has a large surface area as possible. For example, the auxiliary electrode MS preferably but not necessarily has an area corresponding to at least ⅓ of the whole area of the cap substrate ES. Ideally, the inner surface of the cap substrate ES is covered by the auxiliary electrode MS, but actually, such may be not practical or possible. In other instance, another auxiliary electrode may be required for the common line, even though, in this embodiment of the invention, the auxiliary electrode MS is simply for the driving current line VDD. In that instance, each area of each auxiliary electrode MS may be little smaller than ½ of the whole area of the cap substrate ES. That is to say, the auxiliary electrode MS may at least have a surface area larger than ⅓ of the whole surface area of the cap substrate ES.

Then, the material of the sealing CC, connecting the auxiliary electrode MS to the driving current line VDD, should be a material which does not increase the electrical resistance. The sealing CC may include a non-conductive material in an embodiment of the invention, which may be a macromolecular resin material having a base material of epoxy, acryl or silicon, and a hardening material such as a thermal hardening resin material and an UV hardening resin material. In various embodiments of the invention, a conductive sealing material CC further includes a plurality of conductive balls (or particles) within the macromolecular resin material. The conductive balls may be a metal material of which electric conductivity is $0.2\times10^6$ Ω/cm (ohm per centimeter) or more. For instance, the conductive balls may have a diameter of 30 μm and may be made of at least one of gold (Au), silver (Ag), copper (Cu) and nickel (Ni). The conductive balls may have other diameter sizes and may be formed of other materials.

However, it may not be practical or possible to reduce or prevent the voltage dropdown of the driving current line VDD under reasonable conditions just by forming the auxiliary electrode MS with low resistivity and by connecting the auxiliary electrode MS to the driving current line VDD. In order to effectively reduce or prevent the voltage dropdown, there are some additional considerations to consider.

Firstly, the contact resistance between the auxiliary electrode MS and the driving current line VDD should have a low value as possible. Even though the auxiliary electrode MS includes a low resistivity material, if the contact resistance between the auxiliary electrode MS and the driving current line VDD is high, the line resistance of the driving current line VDD cannot be lowered, and the voltage dropdown cannot be reduced or prevented. In order to decrease the contact resistance between the auxiliary electrode MS and the driving current line VDD, the contact area therebetween may be enlarged as possible. However, as shown in FIGS. 3 and 4, the driving current line VDD and the auxiliary electrode MS are connected through the driving line contact hole CNT. Therefore, the driving line contact hole CNT preferably but not necessarily has a large open area as possible. When a ratio of a sum of a contact area to the whole area of the auxiliary electrode MS is over 0.1%, the voltage dropdown can be effectively reduced or prevented. In this instance, the ratio does not refer to a ratio of one exposed area of one driving current line VDD through one driving current line contact hole CNT, but refers to a ratio of the whole exposed area of all driving current lines VDD through all driving current line contact holes CNT over the whole surface of the auxiliary electrode MS.

The second consideration is the conductive balls included in the conductive sealing material CC, and connecting the auxiliary electrode MS and the driving current line VDD electrically. Especially, one of the important things is a conductive balls content. The conductive balls may be balls of gold of which a diameter is about 30 μm, and the content of the conductive balls is about 3-5 wt % of the whole weight of a base material of the conductive sealing CC material. If the conductive balls content is too low (i.e. less than 3 wt %), a contact area between the auxiliary electrode MS and the driving current line VDD is too narrow, so the contact resistance may be increased. On the contrary, if the conductive balls content is too high (i.e. more than 5 wt %), a distribution of the conductive balls in the base material is not stable or electric contact is not good, so an electrical contact effect may not be as effectively accomplished.

In addition, the size of the conductive balls being 30 μm in diameter, may correspond to the cell gap between the TFT substrate and the cap ENC. The conductive balls size, the diameter, may preferably but not necessarily be 5-20% larger than the cell gap. When the TFT substrate and the cap ENC is joined and sealed, a non-conductive shell of the conductive balls may be cracked and the conductive balls may be flattened somewhat by a pressing force that presses together the TFT substrate and the cap ENC, so the conductive balls can electrically connect the auxiliary electrode MS and the driving current line VDD. This conductive balls size is preferable but not required for soft type conductive balls. If all conductive balls are the soft type, when the conductive balls are flattened by the pressing force, there may be the contact failure between the conductive balls and the auxiliary electrode MS or between the conductive balls and the driving current line VDD due to an elastic property of the conductive balls. Therefore, hard type conductive balls may be mixed with the soft type conductive balls. In this instance, a size of the hard type conductive balls may be 80%~90% of a size of the soft type conductive balls. For this instance, when the soft type conductive balls have a diameter of 30 μm, the hard type conductive balls may have a diameter of 25 μm~27 μm. Furthermore, the hard type conductive balls may act as a spacer that maintains the cell gap between the TFT substrate and the cap ENC.

Thirdly, viscosity of a base material, the macromolecular material included in the conductive balls, is important but not necessary. The viscosity of the macromolecular material used in the base material of the sealing material CC is at least 50,000 cPs. Preferably but not necessarily, the viscosity should be at least 250,000 cPs. The viscosity of the base material can affect the contact resistance between the auxiliary electrode MS and the driving current line VDD, as time passes. As the contacting portion may be easily dispatched or degraded when time passes and the viscosity is lowered, the viscosity is one of the important considerations.

Consequently, in the instance that the sealing material CC includes the conductive balls made of gold with 3-5 wt % contents in an epoxy resin having 250,000 cPs viscosity as the base material, after 800 hours passed, the resistance of the driving current line VDD was not different by much. However, in the instance that the sealing material CC includes the conductive balls made of gold with 3 wt % contents in an epoxy resin having 50,000 cPs viscosity as the base material, after passage of 700 hours, the resistance of the driving current line VDD is not so different, but after passage of 800 hours, the resistance was greatly increased.

For a display panel that is a 55-inch organic light emitting diode display manufactured with the auxiliary electrode MS including copper or aluminum, the contact area between the auxiliary electrode MS and the driving current line VDD is over 0.1% of the whole area of the auxiliary electrode MS, the conductive sealing material CC comprises the 30 μm conductive balls made of gold or silver with 3-5 wt % contents in the epoxy resin material having 250,000 cPs viscosity, and the contact resistance between the auxiliary electrode MS and the driving current line VDD can be maintained at about 15.7 mΩ. As a result, the voltage dropdown of the driving current line VDD can be maintained at about 2.3V. This voltage dropdown is much less than the 2.8V which is currently and commercially observed for a typical 55-inch organic light emitting diode display, so that the luminescence and/or brightness distribution uniformity can be over 85%.

The above discussion of the embodiments of the invention was focused on the auxiliary electrode for reducing or preventing the voltage dropdown due to the increased line resistance of the driving current line. However, the same idea can be applied to another auxiliary electrode for reducing or preventing the voltage dropdown of a common line supplying reference voltage. In that instance, as the common line and the driving current line are different lines from each other for supplying different voltages, these auxiliary electrodes should be separately formed into two parts which are not electrically shorted.

While the embodiments of the invention have been described in detail with reference to the drawings, it will be understood by those skilled in the art that the embodiments of invention can be implemented in other specific forms without changing the technical spirit or essential features of the invention. Therefore, it should be noted that the forgoing embodiments are illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic light emitting diode display comprising:
   a thin film transistor substrate including a thin film transistor, a driving current line to supply an electric signal to the thin film transistor, a driving line contact hole to expose some portions of the driving current line, and an organic light emitting diode connected to the thin film transistor;
   a cap including a cap substrate and an auxiliary electrode disposed on a surface of the cap substrate with an area that is at least ⅓ of an area of the cap substrate;
   a conductive sealing material to electrically connect the auxiliary electrode and the driving current line through the driving line contact hole; and
   an organic adhesive joining the thin film transistor substrate and the cap.

2. The organic light emitting diode display according to claim 1, wherein the auxiliary electrode includes a metal material having a resistivity of less than or equal to 5.0 $\mu\Omega cm^2$.

3. The organic light emitting diode display according to claim 2, wherein the auxiliary electrode includes at least one of copper (Cu), nickel (Ni), and aluminum (Al).

4. The organic light emitting diode display according to claim 1, wherein the auxiliary electrode includes a low electric resistance metal layer and a high corrosive resistance metal layer.

5. The organic light emitting diode display according to claim 4, wherein the low electric resistance metal layer includes at least one of copper (Cu), nickel (Ni), and aluminum (Al), and
   the high corrosive resistance metal layer includes at least one of titanium (Ti), molybdenum (Mo), and tantalum (Ta).

6. The organic light emitting diode display according to claim 1, wherein the auxiliary electrode includes a triple layer structure having at least one of Mo/Cu/Mo, Ta/Cu/Ta, MoTi/Cu/MoTi.

7. The organic light emitting diode display according to claim 1, wherein a summation of areas of the driving current line exposed by the driving line contact hole is at least 0.1% of a whole area of the auxiliary electrode.

8. The organic light emitting diode display according to claim 1, wherein the conductive sealing material comprises:
   a base material including at least one of epoxy, acryl and silicon; and
   a plurality of conductive balls including a metal material having an electric conductivity of about $0.2 \times 10^6$ Ω/cm.

9. The organic light emitting diode display according to claim 8, wherein the plurality of conductive balls include at least one of gold (Au), silver (Ag), copper (Cu) and nickel (Ni).

10. The organic light emitting diode display according to claim 8, wherein a content ratio between the plurality of conductive balls and the base material is from 3 (wt %):97 (wt %) to 5 (wt %):95 (wt %).

11. The organic light emitting diode display according to claim 8, wherein the base material has a viscosity in a range from 50,000 cPs to 250,000 cPs.

12. The organic light emitting diode display according to claim 8, wherein the plurality of conductive balls have a diameter of about 30 μm.

13. The organic light emitting diode display according to claim 12, further comprising a cell gap disposed between the thin film transistor substrate and the cap.

14. The organic light emitting diode display according to claim 13, wherein the diameter is about 5%~20% larger than the cell gap.

15. The organic light emitting diode display according to claim 1, wherein the driving line contact hole is formed where the driving current line crosses the conductive sealing material.

* * * * *